(12) United States Patent
Wirbeleit et al.

(10) Patent No.: US 8,003,460 B2
(45) Date of Patent: Aug. 23, 2011

(54) METHOD OF FORMING A SEMICONDUCTOR STRUCTURE COMPRISING A FORMATION OF AT LEAST ONE SIDEWALL SPACER STRUCTURE

(75) Inventors: Frank Wirbeleit, Dresden (DE); Rolf Stephan, Dresden (DE); Peter Javorka, Radeburg (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 657 days.

(21) Appl. No.: 12/028,895

(22) Filed: Feb. 11, 2008

(65) Prior Publication Data

US 2009/0004799 A1 Jan. 1, 2009

(30) Foreign Application Priority Data

Jun. 29, 2007 (DE) .................. 10 2007 030 020

(51) Int. Cl.
*H01L 21/8238* (2006.01)
*H01L 21/336* (2006.01)
(52) U.S. Cl. ............... 438/231; 438/305; 257/E21.626; 257/E21.64
(58) Field of Classification Search .......... 438/231, 438/305, 230, 303; 257/E21.626, E21.64
See application file for complete search history.

(56) References Cited

U.S. PATENT DOCUMENTS

| 5,278,441 | A  | * | 1/1994 | Kang et al. ............... 257/371 |
| 6,541,328 | B2 | * | 4/2003 | Whang et al. ............. 438/231 |
| 2002/0123181 | A1 | | 9/2002 | Hachisuka ............... 438/197 |
| 2004/0180504 | A1 | * | 9/2004 | Lee et al. .................. 438/303 |
| 2005/0287823 | A1 | | 12/2005 | Ramachandran et al. ... 438/791 |

FOREIGN PATENT DOCUMENTS

| JP | 11312741 | 11/1999 |
| JP | 2004349372 | 12/2004 |

OTHER PUBLICATIONS

Official Communication Dated Feb. 7, 2008 for Serial No. 1020070300206.33.

* cited by examiner

*Primary Examiner* — Laura M Menz
*Assistant Examiner* — Daniel Luke
(74) *Attorney, Agent, or Firm* — Williams, Morgan & Amerson, P.C.

(57) ABSTRACT

According to an illustrative example, a method of forming a semiconductor structure comprises providing a semiconductor substrate comprising a first feature and a second feature. A material layer is formed over the first feature and the second feature. A mask is formed over the first feature. At least one etch process adapted to form a sidewall spacer structure adjacent the second feature from a portion of the material layer is performed. The mask protects a portion of the material layer over the first feature from being affected by the at least one etch process. An ion implantation process is performed. The mask remains over the first feature during the ion implantation process.

13 Claims, 10 Drawing Sheets

_METHOD OF FORMING A SEMICONDUCTOR STRUCTURE COMPRISING A FORMATION OF AT LEAST ONE SIDEWALL SPACER STRUCTURE_

BACKGROUND OF THE INVENTION

1. Field of the Invention

The present disclosure generally relates to the manufacture of integrated circuits, and, more particularly, to methods of forming a semiconductor structure wherein ion implantation processes are performed to form dopant profiles adjacent features formed on a semiconductor substrate.

2. Description of the Related Art

Integrated circuits comprise a large number of individual circuit elements such as, e.g., transistors, capacitors and resistors. These elements are connected internally to form complex circuits such as memory devices, logic devices and microprocessors. The performance of integrated circuits may be improved by increasing the number of functional elements per circuit in order to increase their functionality and/or by increasing the speed of operation of the circuit elements. A reduction of feature sizes allows the formation of a greater number of circuit elements on the same area, hence allowing an extension of the functionality of the circuit, and also reduces signal propagation delays, thus making an increase of the speed of operation of circuit elements possible.

Field effect transistors are used as switching elements in integrated circuits. They provide a means to control a current flowing through a channel region located between a source region and a drain region. The source region and the drain region are highly doped. In N-type transistors, the source and drain regions are doped with an N-type dopant. Conversely, in P-type transistors, the source and drain regions are doped with a P-type dopant. The doping of the channel region is inverse to the doping of the source region and the drain region. The conductivity of the channel region is controlled by a gate voltage applied to a gate electrode formed above the channel region and separated therefrom by a thin insulating layer. Depending on the gate voltage, the channel region may be switched between a conductive "on" state and a substantially non-conductive "off" state.

Figure 1A:
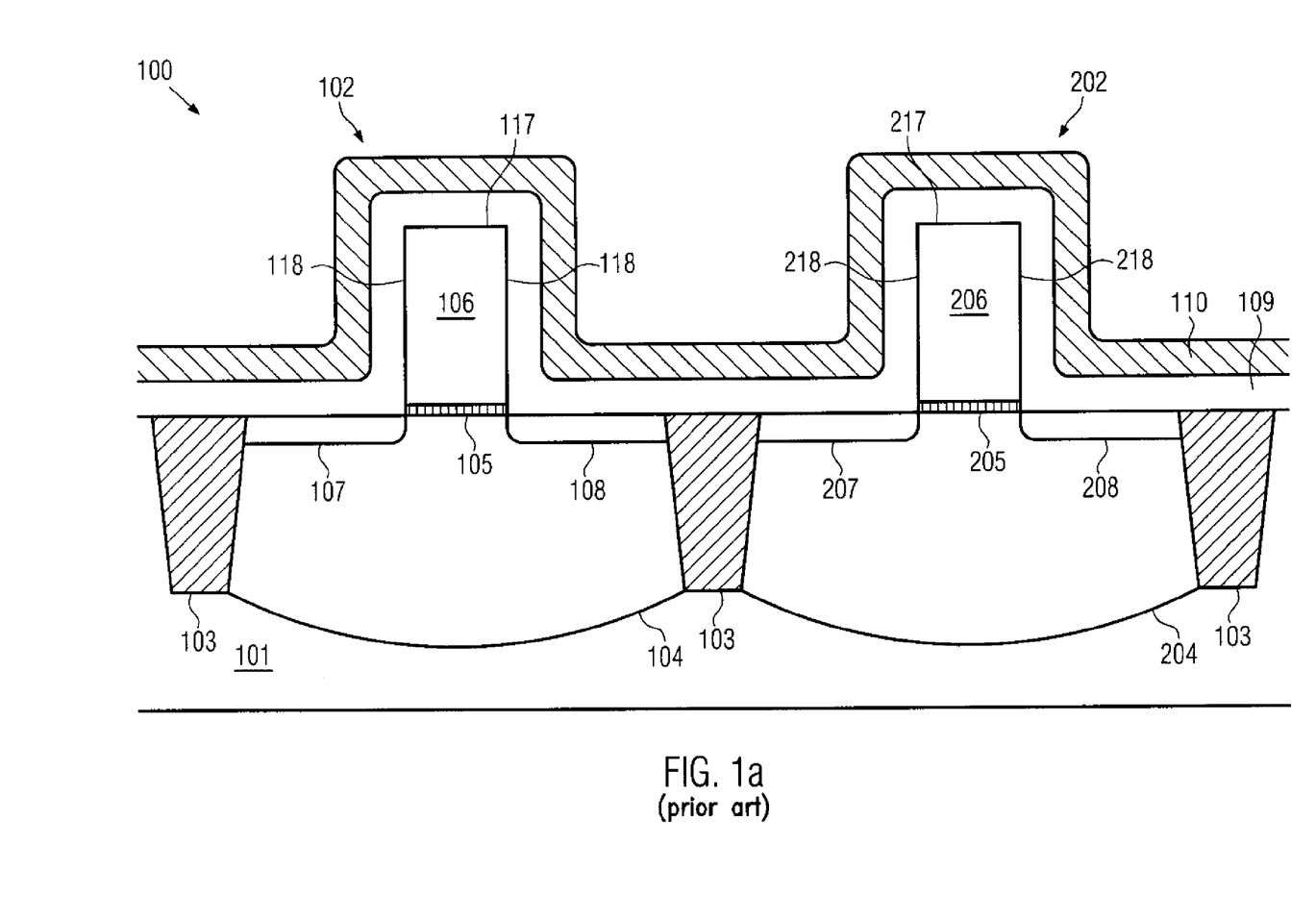
FIGS. 1a-1c show schematic cross-sectional views of a semiconductor structure in stages of a manufacturing process according to the state of the art.

A method of forming a semiconductor structure comprising field effect transistors according to the state of the art will be described in the following with reference to FIGS. 1a-1c. FIG. 1a shows a schematic cross-sectional view of a semiconductor structure 100 in a first stage of the method according to the state of the art.

The semiconductor structure 100 comprises a substrate 101. A first transistor element 102, comprising an active region 104, a gate electrode 106 and a gate insulation layer 105, providing electrical insulation between the gate electrode 106 and the active region 104, is formed in the substrate 101. The gate electrode 106 may have a top surface 117 and a side surface 118. An extended source region 107 and an extended drain region 108 are formed adjacent the gate electrode 106. The substrate 101 further comprises a second transistor element 202. Similar to the first transistor element 102, the second transistor element 202 comprises an active region 204, a gate electrode 206, having a top surface 217 and a side surface 218, a gate insulation layer 205, an extended source region 207 and an extended drain region 208. A trench isolation structure 103 provides electrical insulation between the first transistor element 102 and the second transistor element 202.

The above-described features may be formed by means of methods of photolithography, etching, deposition, oxidation and ion implantation, well known to persons skilled in the art.

In particular, the active regions 104, 204, the extended source regions 107, 207 and the extended drain regions 108, 208 may be formed by means of known ion implantation processes wherein the semiconductor structure 100 is irradiated with ions of a dopant material. In some examples of methods of forming a semiconductor structure according to the state of the art, the first transistor element 102 may be a P-type transistor and the second transistor element 202 may be an N-type transistor. In such embodiments, ions of a P-type dopant may be implanted into the extended source region 107 and the extended drain region 108 of the first transistor element 102, and ions of an N-type dopant may be implanted into the extended source region 207 and the extended drain region 208 of the second transistor element 202. In each of these implantation processes, one of the transistor elements 102, 202 may be covered with a mask comprising, for example, a photoresist, while ions are implanted into the other of the transistor elements 102, 202. The masks may be formed by means of techniques of photolithography well known to persons skilled in the art.

A layer 109 comprising a first material and a layer 110 comprising a second material may then be formed over the semiconductor structure 100. In some examples of methods according to the state of the art, the layer 109 may comprise silicon nitride and the layer 110 may comprise silicon dioxide. The layers 109, 110 may be formed by means of well-known deposition processes such as chemical vapor deposition (CVD) and/or plasma enhanced chemical vapor deposition (PECVD).

Figure 1B:
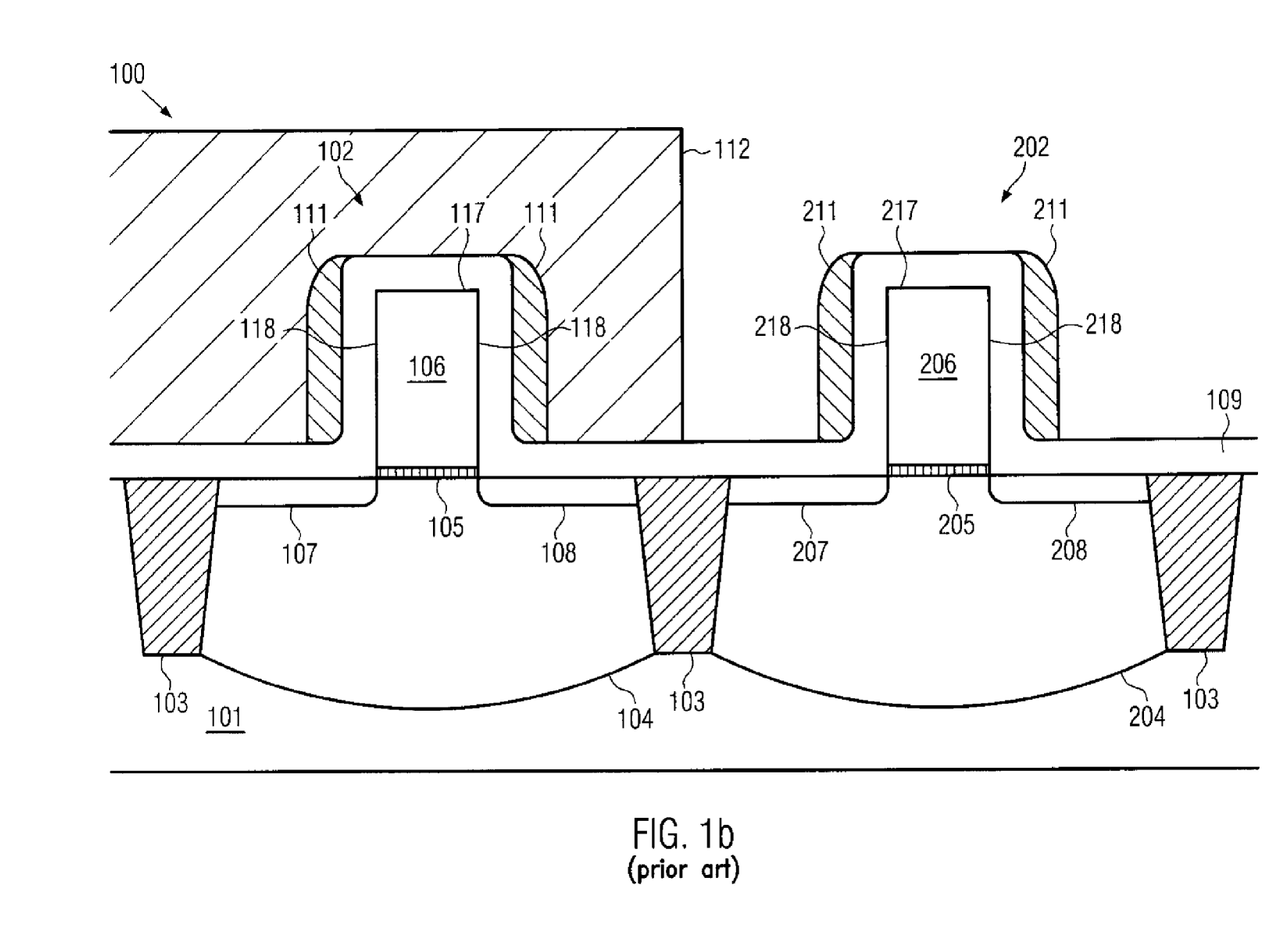

FIG. 1b shows a schematic cross-sectional view of the semiconductor structure 100 in a later stage of the manufacturing process according to the state of the art. After the formation of the layers 109, 110, an anisotropic etch process may be performed wherein the semiconductor structure 100 is exposed to an etchant adapted to selectively remove the material of the layer 110, leaving the material of the layer 109 substantially intact. In some examples of prior art manufacturing processes, the anisotropic etch process may comprise a known dry etch process.

As persons skilled in the art know, in anisotropic etching, substantially horizontal portions of the layer 110 of second material, such as, for example, portions over the extended source regions 107, 207, the extended drain regions 108, 208 and the top surfaces 117, 217 of the gate electrodes 106, 206, are etched at a greater etch rate than portions of the layer 110 being inclined or substantially vertical, such as portions over the side surfaces 118, 218 of the gate electrodes 106, 206.

The anisotropic etch process may be stopped upon a substantial removal of the portions of the layer 110 of the second material over the horizontal portions of the semiconductor structure 100. Thus, portions of the layer 110 may remain on the semiconductor structure 100 to form sidewall spacer structures 111, 211 adjacent the gate electrode 106 of the first transistor element 102 and the gate electrode 206 of the second transistor element 202.

Thereafter, the first transistor element 102 may be covered with a mask 112. The mask 112 may comprise a photoresist, and may be formed by means of techniques of photolithography well known to persons skilled in the art.

Figure 1C:
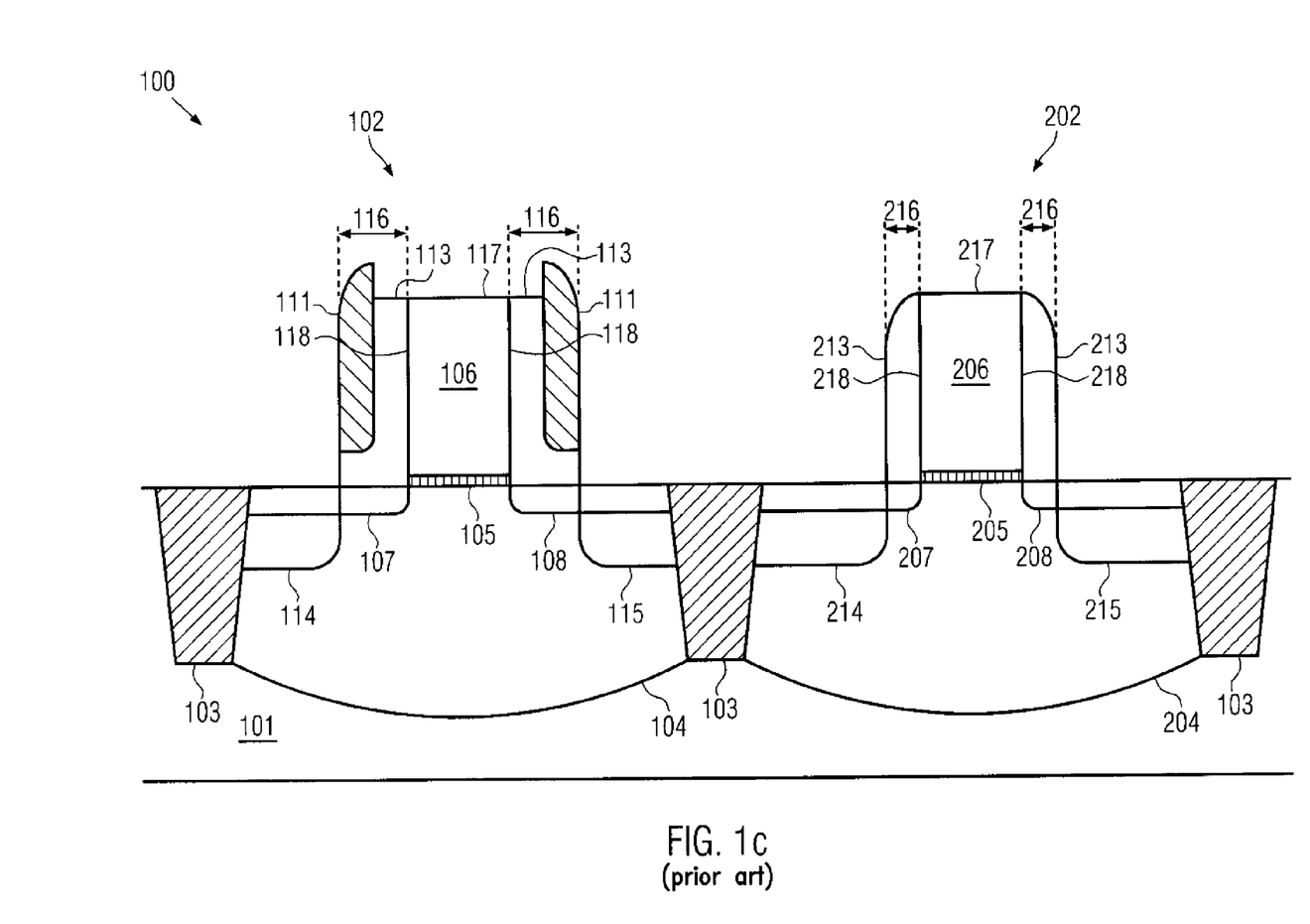

FIG. 1c shows a schematic cross-sectional view of the semiconductor structure 100 in a later stage of the manufacturing process according to the state of the art. After the formation of the mask 112, an etch process, wherein the semiconductor structure 100 is exposed to an etchant adapted to selectively remove the second material in the sidewall spacer structures 111, 112, may be performed. In examples of methods of forming a semiconductor structure wherein the second material comprises silicon dioxide, the etch process may be a wet etch process wherein the semiconductor structure 100 is exposed to diluted hydrofluoric acid.

The etch process may remove the sidewall spacer structure 211 adjacent the gate electrode 206 of the second transistor element 202. The first transistor element 102, however, may be protected from being affected by the etchant by the mask 112. Therefore, the sidewall spacer structure 111 adjacent the gate electrode 106 of the first transistor element 102 remains on the semiconductor structure 100. After the etch process, the mask 112 may be removed by means of a known resist strip process.

Subsequently, a further anisotropic etch process, which may, in some examples of methods of forming a semiconductor structure according to the state of the art, comprise a dry etch process, may be performed. An etchant used in the anisotropic etch process may be adapted to selectively remove the first material in the layer 109, leaving the second material in the sidewall spacer structure 111 adjacent the gate electrode 106 of the first transistor element 102 substantially intact.

The anisotropic etch process may be stopped upon a substantial removal of portions of the layer 109 of the first material over horizontal portions of the semiconductor structure 100. In particular, portions of the layer 109 over the extended source regions 107, 207, the extended drain regions 108, 208 and the top surfaces 117, 217 of the gate electrodes 106, 206 may be substantially removed. Portions of the layer 109 over the sidewalls 118, 218 of the gate electrodes 106, 206, however, may remain on the semiconductor structure 100 to form a sidewall spacer structure 113 adjacent the gate electrode 106 and a sidewall spacer structure 213 adjacent the gate electrode 206.

Thus, in the method of forming a semiconductor structure according to the state of the art, two sidewall spacer structures 113, 111 are formed adjacent the gate electrode 106 of the first transistor element 102, and a single sidewall spacer structure 213 is formed adjacent the gate electrode 206 of the second transistor element 202.

After the formation of the sidewall spacer structures 111, 113, 213, an ion implantation process may be performed to form a source region 114 and a drain region 115 adjacent the gate electrode 106. In the ion implantation process, the semiconductor structure 100 may be irradiated with ions of a dopant material. The second transistor element 202 may be covered by a mask (not shown) during the ion implantation process. The sidewall spacer structures 113, 111 may absorb ions impinging on the sidewall spacer structures 113, 111 such that the source region 114 and the drain region 115 are spaced apart from the gate electrode 106 by a distance 116 corresponding to the combined thickness of the sidewall spacer structures 113, 111.

A further ion implantation process may be performed to form a source region 214 and a drain region 215 adjacent the gate electrode 206 of the second transistor element 202. A mask (not shown) may be formed over the first transistor element 102 to protect the first transistor element 102 from being irradiated with ions. The sidewall spacer structure 213 may absorb ions impinging on the sidewall spacer structure 213 such that the source region 214 and the drain region 215 are spaced apart from the gate electrode 206 by a distance 216 corresponding to the thickness of the sidewall spacer structure 213.

The distance 216 may be smaller than the distance 116. Therefore, compared to the source and drain regions 214, 215 of the second transistor element 202, the source and drain regions 114, 115 of the first transistor element 102 may be provided at a greater distance to the gate electrode of the respective transistor element. In examples of manufacturing processes according to the state of the art wherein the first transistor element 102 is a P-type transistor and the second transistor element 202 is an N-type transistor, this may allow an adaptation of the dopant profiles in the transistor elements 102, 202 to the specific properties of P-type and N-type dopants, respectively.

A problem of the above-described method of forming a semiconductor structure according to the state of the art is that a photolithography process is required to form the mask 112 such as to obtain a different spacing between the source and drain regions, respectively, and the gate electrode in the first and the second transistor element. In addition to the photolithographic process performed in the formation of the mask 112, two further photolithographic processes may be required to form masks covering the transistor elements 102, 202 during the ion implantation processes performed to create the source regions 114, 214 and the drain regions 115, 215. Hence, in summary, the formation of the source regions 114, 214 and the drain regions 115, 215 may comprise three photolithographic processes. As persons skilled in the art know, photolithographic processes may contribute significantly to the cost and complexity of the manufacturing process, since photolithography may require costly and complex tools providing the high degree of precision and working accuracy required in advanced semiconductor manufacturing technology. Hence, the above-described method of forming a semiconductor structure may be relatively expensive and time-consuming.

The present disclosure is directed to various methods that may avoid, or at least reduce, the effects of one or more of the problems identified above.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

According to one illustrative example, a method of forming a semiconductor structure comprises providing a semiconductor substrate comprising a first feature and a second feature, a material layer being formed over the first feature and the second feature. A mask is formed over the first feature. At least one etch process adapted to form a sidewall spacer structure adjacent the second feature from a portion of the material layer is performed. The mask protects a portion of the material layer over the first feature from being affected by the at least one etch process. An ion implantation process is performed. The mask remains over the first feature during the ion implantation process.

According to another illustrative example, a method of forming a semiconductor structure comprises providing a semiconductor substrate comprising a first feature and a second feature. A layer of a first material and a layer of a second material are formed over the first feature and the second feature. A first mask is formed over the first feature. At least one first etch process adapted to remove portions of the layer of second material over the second feature and to form at least one first sidewall spacer structure adjacent the second feature is performed. A first ion implantation process is performed.

The first mask remains over the first feature during the first ion implantation process. A second mask is formed over the second feature. At least one second etch process adapted to remove portions of the layer of first material over the first feature and to form at least one second sidewall spacer structure adjacent the first feature is performed. A second ion implantation process is performed. The second mask remains over the second feature during the second ion implantation process.

BRIEF DESCRIPTION OF THE DRAWINGS

The disclosure may be understood by reference to the following description taken in conjunction with the accompanying drawings, in which like reference numerals identify like elements, and in which.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION OF THE INVENTION

Various illustrative embodiments of the invention are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

According to one embodiment, a material layer is formed over a first feature and a second feature formed over a substrate. In some embodiments, the substrate may comprise a wafer comprising a semiconductor material such as silicon. The first feature and the second feature may be gate electrodes of a first transistor element and a second transistor element, respectively. The material layer may comprise a sidewall spacer material which may be a dielectric material such as silicon dioxide and/or silicon nitride. In some embodiments, the material layer may comprise a plurality of sub-layers comprising different materials. For example, the material layer may comprise a sub-layer of a first material and a sub-layer of a second material.

The first feature may be covered by a mask. The mask may comprise a photoresist and may be formed by means of methods of photolithography well known to persons skilled in the art. Thereafter, at least one etch process may be performed. The at least one etch process may comprise an anisotropic etch process, for example, a dry etch process, adapted to selectively remove one or more of the materials of the material layer, leaving the material of the substrate, as well as the material of the first and the second feature, substantially intact. The mask may protect portions of the material layer over the first transistor element from being affected by an etchant used in the etch process. Hence, only portions of the material layer over the second transistor element are etched.

In the etch process, portions of the material layer over substantially horizontal portions of the semiconductor structure, for example, portions over the top surface of the second feature or portions over the substrate, may be etched with a greater etch rate than inclined portions of the material layer, such as portions at the sidewalls of the second feature. The etch process may be stopped upon a substantial removal of the substantially horizontal portions of the material layer. Thus, a sidewall spacer structure may be formed from portions of the material layer at the sidewall of the second feature.

After the etch process, an ion implantation process may be performed, wherein the mask may remain on the semiconductor structure during the ion implantation process. In the ion implantation process, the semiconductor structure may be irradiated with ions of a dopant material to form doped regions adjacent the second feature and the sidewall spacer structure. In embodiments wherein the second feature comprises a gate electrode of a transistor element, the doped regions may comprise a source region and a drain region of the transistor element. Ions impinging on the mask may be absorbed by the mask and the portion of the material layer below the mask such that substantially no dopant ions are incorporated into portions of the substrate adjacent the first feature.

Hence, sidewall spacer structures and doped regions in the substrate may be selectively formed adjacent the second feature. For this purpose, only one photolithographic process is required, which is performed in order to form the mask. After the formation of the sidewall spacers and the source and drain regions adjacent the second transistor element described above, further manufacturing steps may be performed to form a sidewall spacer structure and doped regions adjacent the first feature.

The further manufacturing steps may comprise forming a mask over the second feature, performing at least one etch process adapted to form a sidewall spacer structure adjacent the first feature from another portion of the material layer, wherein the mask protects portions of the material layer over the second feature, such as the sidewall spacer structure adjacent the second feature formed from the material layer, from being affected by the at least one etch process, and performing an ion implantation process to form doped regions adjacent the first feature, wherein the mask remains over the second feature during the ion implantation process.

The at least one etch process employed in the formation of the sidewall spacer structure adjacent the first feature may be different from the at least one etch process employed in the formation of the sidewall spacer structure adjacent the second feature. Hence, the doped regions formed adjacent the first feature may have a distance to the first feature which is different from the distance between the second feature and the doped regions formed adjacent the second feature. As already mentioned above, the doped regions may comprise source and drain regions of a first and a second transistor element. Consequently, the subject matter disclosed herein allows the formation of different dopant profiles in the first and the second transistor element, wherein not more than two masks need to be formed by means of photolithographic processes. Thus, the number of photolithographic processes required may be reduced compared to the method according to the state of the art described above with reference to FIGS. 1a-1c.

Figure 2A:
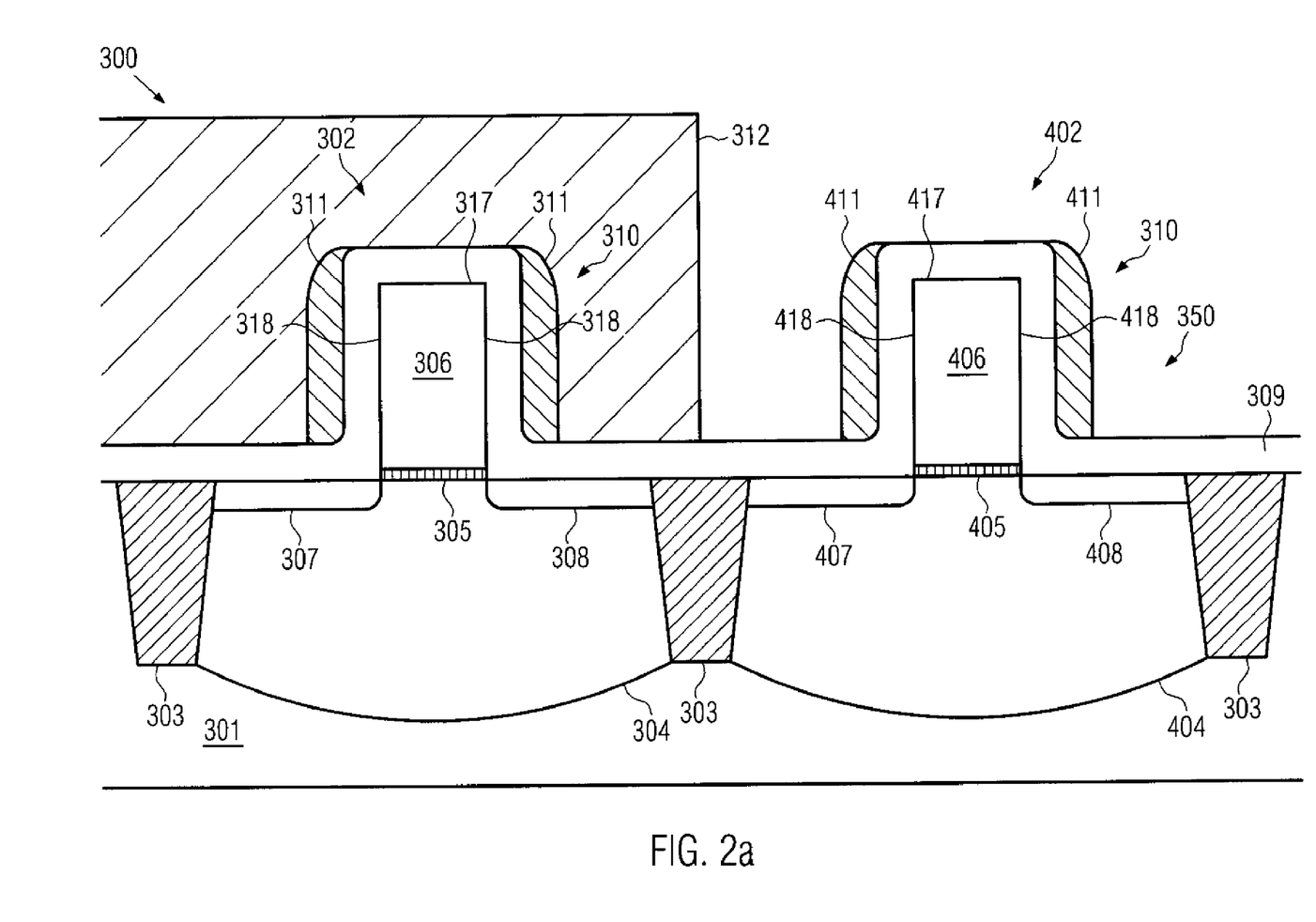
FIGS. 2a-2c show schematic cross-sectional views of a semiconductor structure in stages of a manufacturing process according to one illustrative embodiment.

FIG. 2a shows a schematic cross-sectional view of a semiconductor structure 300 in a first stage of a method of forming a semiconductor structure. The semiconductor structure 300 comprises a substrate 301. In the substrate 301, a first transistor element 302 and a second transistor element 402 are formed. The first transistor element 302 comprises a gate electrode 306 formed over an active region 304 and separated therefrom by a gate insulation layer 305. Adjacent the gate electrode 306, an extended source region 307 and an extended drain region 308 may be formed. The gate electrode 306 may have a top surface 317 and a side surface 318. The semiconductor structure 300 further comprises a second transistor element 402. Similar to the first transistor element 302, the second transistor element 402 comprises a gate electrode 406 having a top surface 417 and a side surface 418, a gate insulation layer 405, an active region 404, an extended source region 407 and an extended drain region 408. A trench isolation structure 303 provides electrical insulation between the first transistor element 302, the second transistor element 402 and further circuit elements in the semiconductor structure 300 which are not shown in FIG. 2a. Similar to the formation of the semiconductor structure 100 described above with reference to FIGS. 1a-1c, the above-described features may be formed by means of methods of photolithography, etching, deposition, oxidation and ion implantation known to persons skilled in the art.

The first transistor element 302 and the second transistor element 402 may be transistors of a different type. In some embodiments, the first transistor element 302 may be a P-type transistor and the second transistor element 402 may be an N-type transistor. In other embodiments, the first transistor element 302 may be an N-type transistor and the second transistor element 402 may be a P-type transistor.

A layer 309 of a first material and a layer 310 of a second material are formed over the first transistor element 302 and the second transistor element 402. FIG. 2a shows the semiconductor structure 300 in a stage wherein the layer 310 has been processed to form sidewall spacer structures 311, 411, as will be explained in more detail below. Hence, not the entire layer 310 as formed can be seen in FIG. 2a. In some embodiments, the layer 309 and the layer 310 may be provided in the form of sub-layers of a material layer 350 formed over the semiconductor structure 300.

The layer 309 of the first material and the layer 310 of the second material may be formed by means of deposition techniques known to persons skilled in the art, such as chemical vapor deposition and/or plasma enhanced chemical vapor deposition.

The first material and the second material may be selected such that the layer 309 of the first material and the layer 310 of the second material may be etched selectively. In selective etching, the semiconductor structure 300 may be exposed to an etchant adapted to remove the material of one of the layers 309, 310, leaving the material of the other of the layers 309, 310 substantially intact.

In one embodiment, the layer 309 may comprise silicon nitride and the layer 310 may comprise silicon dioxide. In other embodiments, the layer 309 may comprise silicon dioxide and the layer 310 may comprise silicon nitride. Etch chemistries allowing a selective etching of silicon dioxide and silicon nitride are known to persons skilled in the art or may readily be determined by routine experiments.

After the formation of the layers 309, 310, an etch process may be performed to form sidewall spacer structures 311 and 411, respectively, from the layer 310 adjacent the gate electrode 306 of the first transistor element 302 and the gate electrode 406 of the second transistor element 402, respectively. The etch process may be adapted to selectively remove the second material of the layer 310, leaving the first material of the layer 309 substantially intact.

In some embodiments, the etch process may be a dry etch process. As persons skilled in the art know, in dry etching, the semiconductor structure 300 is inserted into a reactor vessel, and an etch gas is supplied to the reactor vessel. In the etch gas, a glow discharge may be created by applying a radio frequency alternating voltage to the etch gas. Additionally, a bias voltage, which may be a direct voltage or a low frequency alternating voltage, may be applied between the semiconductor structure 300 and the etch gas. In the glow discharge, chemically reactive species such as atoms, radicals, and ions may be created from the etch gas. The chemically reactive species may react with the second material of the layer 310, creating a volatile reaction product which can be pumped out of the reactor vessel. Parameters such as a composition of the etch gas, frequency and amplitude of the radio frequency alternating voltage and the bias voltage, temperature and pressure may be adapted such that the chemically reactive species react with the second material of the layer 310 to a greater extent than with the first material of the layer 309 in order to obtain a selectivity of the etch process.

The etch process may be anisotropic. In anisotropic etching, portions of the layer 310 having a substantially horizontal surface, such as portions over the extended source regions 307, 407, the extended drain regions 308, 408, the trench isolation structure 303 and the top surfaces 317, 417 of the gate electrodes 306, 406, are removed with a greater etch rate than portions of the layer 310 having an inclined surface, such as portions over the sidewalls of the gate electrodes 306, 406. In embodiments wherein the etch process comprises a dry etch process, a degree of anisotropy of the etch process may be controlled by varying parameters of the etch process, in particular, by varying the bias voltage.

The etch process may be stopped upon a substantial removal of the portions of the layer 310 of the second material having a substantially horizontal surface. Due to the anisotropy of the etch process, residues of the portions of the layer 310 having an inclined surface, in particular the portions over the sidewalls of the gate electrodes 306, 406, may remain on the semiconductor structure 300 to form the sidewall spacer structure 311, 411.

After the formation of the sidewall spacer structures 311, 411, a mask 312 may be formed over the first transistor element 302. The mask 312 may comprise a photoresist and may be formed by means of techniques of photolithography well known to persons skilled in the art.

Figure 2B:
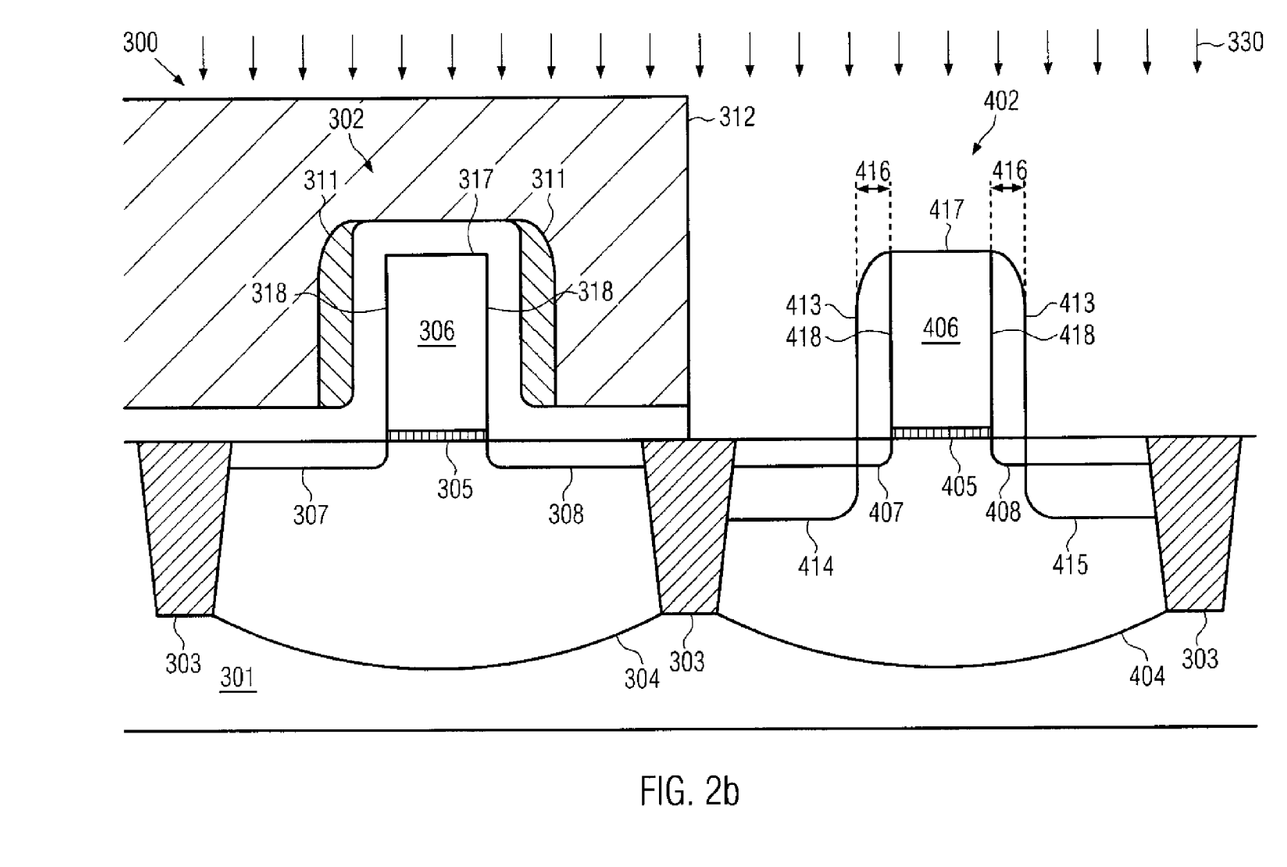

FIG. 2b shows a schematic cross-sectional view of the semiconductor structure 300 in a later stage of the manufacturing process. After the formation of the mask 312, an etch process may be performed wherein the semiconductor structure 300 is exposed to an etchant adapted to selectively remove the second material in the sidewall spacer structure 411, leaving the layer 309 and the mask 312 substantially intact. In the etch process, the sidewall spacer structure 411 adjacent the gate electrode 406 of the second transistor element 402 may be removed. The sidewall spacer structure 311 adjacent the gate electrode 306 of the first transistor element 302, however, may be protected by the mask 312 and, thus, may remain on the semiconductor structure 300.

The etch process may be an isotropic etch process. In isotropic etching, an etch rate may be substantially independent of the orientation of the surface exposed to the etchant. Thus, the sidewall spacer structure 411 may be efficiently removed.

In some embodiments, the etch process may be a wet etch process wherein the semiconductor structure 300 is exposed to an aqueous solution of a chemical compound reacting with the second material of the sidewall spacer structure 411, for example, by inserting the semiconductor structure 300 into the solution or by spraying the solution onto the semiconductor structure 300. In embodiments wherein the second material comprises silicon dioxide, the semiconductor structure 300 may be exposed to diluted hydrofluoric acid (HF). In other embodiments, the sidewall spacer structure 411 may be removed by means of a dry etch process.

The present disclosure is not restricted to embodiments wherein the sidewall spacer structure 411 is completely removed. In other embodiments, the etch process may be stopped prior to complete removal of the sidewall spacer structure 411. Hence, portions of the sidewall spacer structure 411 may remain on the semiconductor structure 300. A shape of the sidewall spacer structure 411, however, may be modified in the etch process, wherein the shape of the sidewall spacer structure 311 is not modified.

In some of these embodiments, the etch process may be an isotropic etch process or an anisotropic etch process having a low degree of asymmetry. Thus, a thickness 416 of the sidewall spacer structure 411 may be reduced. In other embodiments, the etch process may be an anisotropic etch process having a moderately high degree of asymmetry. Thus, a height of the sidewall spacer structure 411 may be reduced, wherein a thickness of the sidewall spacer structure 411 may remain substantially unchanged. This may help to obtain a more tapered shape of the sidewall spacer structure 411. Advantageously, a tapered shape of the sidewall spacer structure 411 may help to avoid a formation of voids between the transistor elements 302, 402 when a layer of an interlayer dielectric is formed over the semiconductor structure 300.

After the removal or modification of the sidewall spacer structure 411, an anisotropic etch process, for example, a dry etch process, adapted to selectively remove the first material in the layer 309, may be performed. The anisotropic etch process may be stopped upon a substantial removal of substantially horizontal portions of the layer 309 over the second transistor element 402. Thus, inclined portions of the layer 309 over the side surface 418 of the gate electrode 406 of the second transistor element 402 may remain on the semiconductor structure 300, forming a sidewall spacer structure 413 adjacent the gate electrode 406.

Subsequently, an ion implantation process may be performed wherein the semiconductor structure 300 is irradiated with ions of a dopant material, as indicated by arrows 330 in FIG. 2b. The mask 312 may remain on the semiconductor structure 300 during the ion implantation process. The ions 330 may impinge on portions of the substrate 301 adjacent the gate electrode 406 of the second transistor element 402, and may be incorporated into the substrate 301 such that a source region 414 and a drain region 415 are formed. Ions impinging on the sidewall spacer structure 413 may be absorbed by the sidewall spacer structure 413 such that the source region 414 and the drain region 415 are spaced apart from the gate electrode 406 by a distance 416 which may substantially correspond to a thickness of the sidewall spacer structure 413.

Ions impinging on the first transistor element 302 may be absorbed in the mask 312 and/or a portion of the layer 309 below the mask 312. Hence, the mask 312 may protect portions of the substrate 301 adjacent the gate electrode 306 of the first transistor element 302 from being irradiated with ions. Thus, the source region 414 and the drain region 415 may be selectively formed in the second transistor element 402.

In some embodiments, a thickness of the mask 312 may be reduced during the etch processes performed in order to remove the sidewall spacer structure 411 and to form the sidewall spacer structure 413. In such embodiments, only a portion of the ions impinging on the first transistor element 302 may be absorbed in the mask 312, whereas some ions may penetrate the mask 312 and may be absorbed in the portion of the layer 309 of the first material over the first transistor element. Hence, the first transistor element 302 may be protected from being irradiated with ions both by the mask 312 and by the layer 309 of the first material.

Figure 2C:
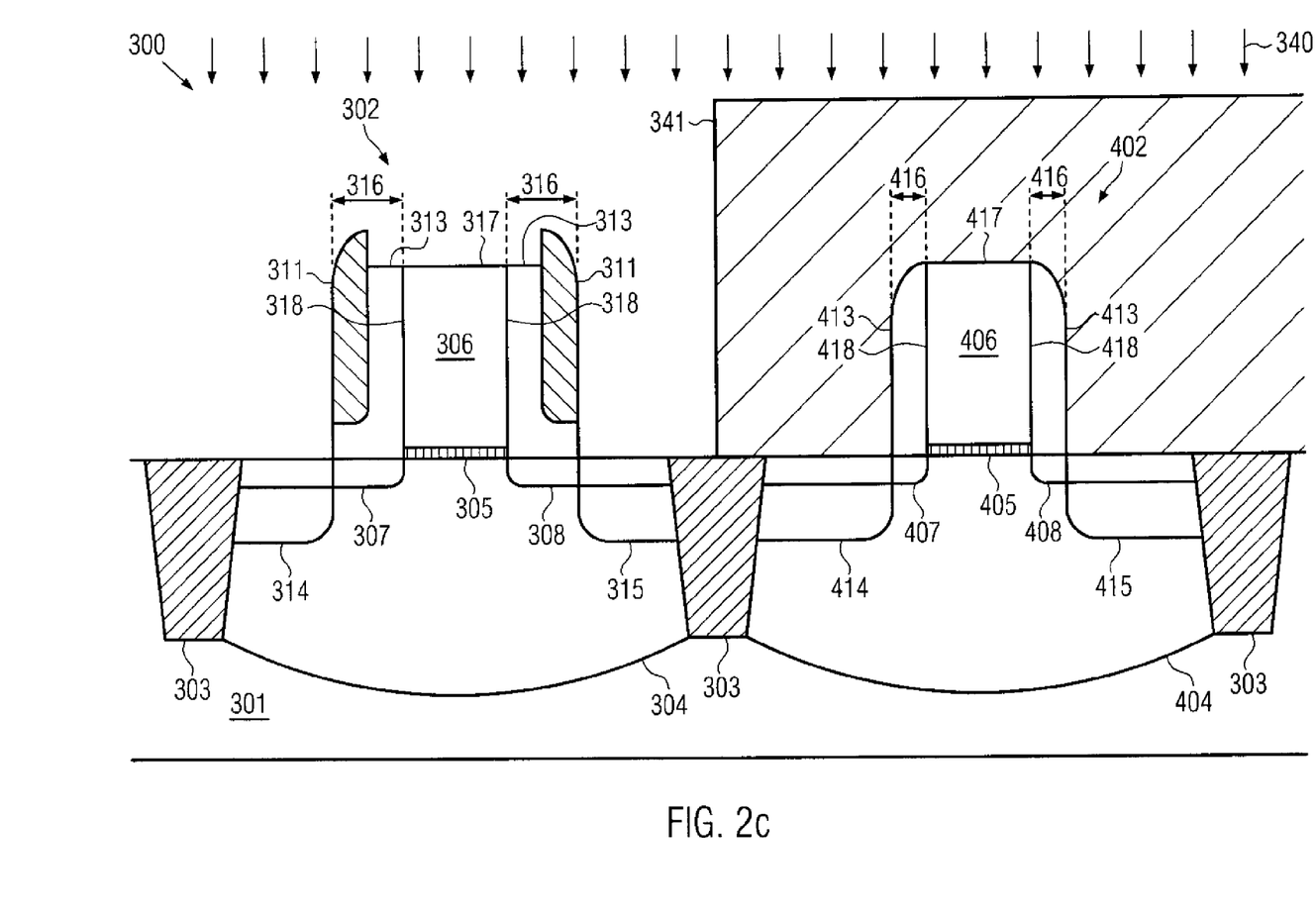

FIG. 2c shows a schematic cross-sectional view of the semiconductor structure 300 in a later stage of the manufacturing process. After the ion implantation process performed in order to form the source region 414 and the drain region 415, the mask 312 covering the first transistor element 302 may be removed by means of a known resist strip process and a mask 341 may be formed over the second transistor element 402. The mask 341 may comprise a photoresist and may be formed by means of techniques of photolithography well known to persons skilled in the art.

Thereafter, an etch process may be performed wherein the semiconductor structure 300 is exposed to an etchant adapted to selectively remove the first material in the layer 309, leaving the second material in the sidewall spacer structure 311 and the mask 341 substantially intact. The etching process may be anisotropic, and may, in some embodiments, comprise a dry etch process.

The anisotropic etch process may be stopped upon substantial removal of substantially horizontal portions of the layer 309 over the extended source region 307, the extended drain region 308 and the top surface 317 of the gate electrode 306 of the first transistor element 302. Due to the anisotropy of the etch process, residues of the layer 309 over the side surface 318 of the gate electrode 306 may remain on the semiconductor structure 300 to form a sidewall spacer structure 313.

Since the anisotropic etch process may be configured to substantially not affect the sidewall spacer structure 311 comprising the second material, after the etch process, two sidewall spacer structures, namely the sidewall spacer structure 313 and the sidewall spacer structure 311, may be provided adjacent the gate electrode 306 of the first transistor element 302. The sidewall spacer structures 311, 313 together may have a thickness 316 being greater than the thickness 416 of the sidewall spacer structure 413 adjacent the gate electrode 406 of the second transistor element 402.

After the formation of the sidewall spacer structure 313, an ion implantation process may be performed wherein the semiconductor structure 300 is irradiated with ions of a dopant material, as indicated by arrows 340 in FIG. 2c. The mask 341 may remain on the semiconductor structure 300 during the ion implantation process. The ions 340 may impinge on the first transistor element 302, such that a source region 314 and a drain region 315 are formed adjacent the gate electrode 306 of the first transistor element 302. Since the sidewall spacer structures 311, 313 may absorb ions impinging on the sidewall spacer structures 311, 313, a distance between the source region 314 and the gate electrode 306, and a distance between the drain region 315 and the gate electrode 306, respectively, may be substantially equal to the combined thickness 316 of the sidewall spacer structures 311, 313. Therefore, the distance of the source region 314 and the drain region 315 to the gate electrode 306 in the first transistor element 302 may be greater than the distance of the source region 414 and the drain region 415 to the gate electrode 406 in the second transistor element 402. Hence, dopant profiles in the first transistor element 302 and the second transistor element 402 may be different.

After the formation of the source region 314 and the drain region 315, the mask 341 may be removed by means of a known resist strip process.

As detailed above, in some embodiments, the first transistor element 302 and the second transistor element 402 may be transistors of a different type. For example, the first transistor element 302 may be a P-type transistor and the second transistor element 403 may be an N-type transistor. In such embodiments, the ions 330 may comprise ions of a P-type dopant and the ions 340 may comprise ions of an N-type dopant. Thus, the above-described method of forming a semiconductor structure allows the formation of different dopant profiles in P-type transistors and in N-type transistors.

In the method of forming a semiconductor structure according to the state of the art described above with reference to FIGS. 1a-1c, three masks are required in order to provide source and drain regions in the first transistor element 102 and the second transistor element 202, wherein the distance between the source and drain regions and the gate electrode in the first transistor element 102 is greater than in the second transistor element 202: the mask 112, as well two masks not shown in the figures which are respectively used to cover one of the transistor elements 102, 202 while source and drain regions are formed in the other transistor element 102, 202.

Contrary thereto, in the above-described method of forming the semiconductor structure 300, only two masks 312, 341 are required in order to form the source regions 314, 414 and the drain regions 315, 415. Hence, the number of photolithographic processes performed in the method of forming a semiconductor structure may be reduced, which may help to reduce the cost and complexity of the manufacturing process.

Further embodiments will be described with reference to FIGS. 3a-3b. For convenience, in FIGS. 3a-3b, as well as in FIGS. 2a-2c, like components are denoted by like reference numerals.

Figure 3A:
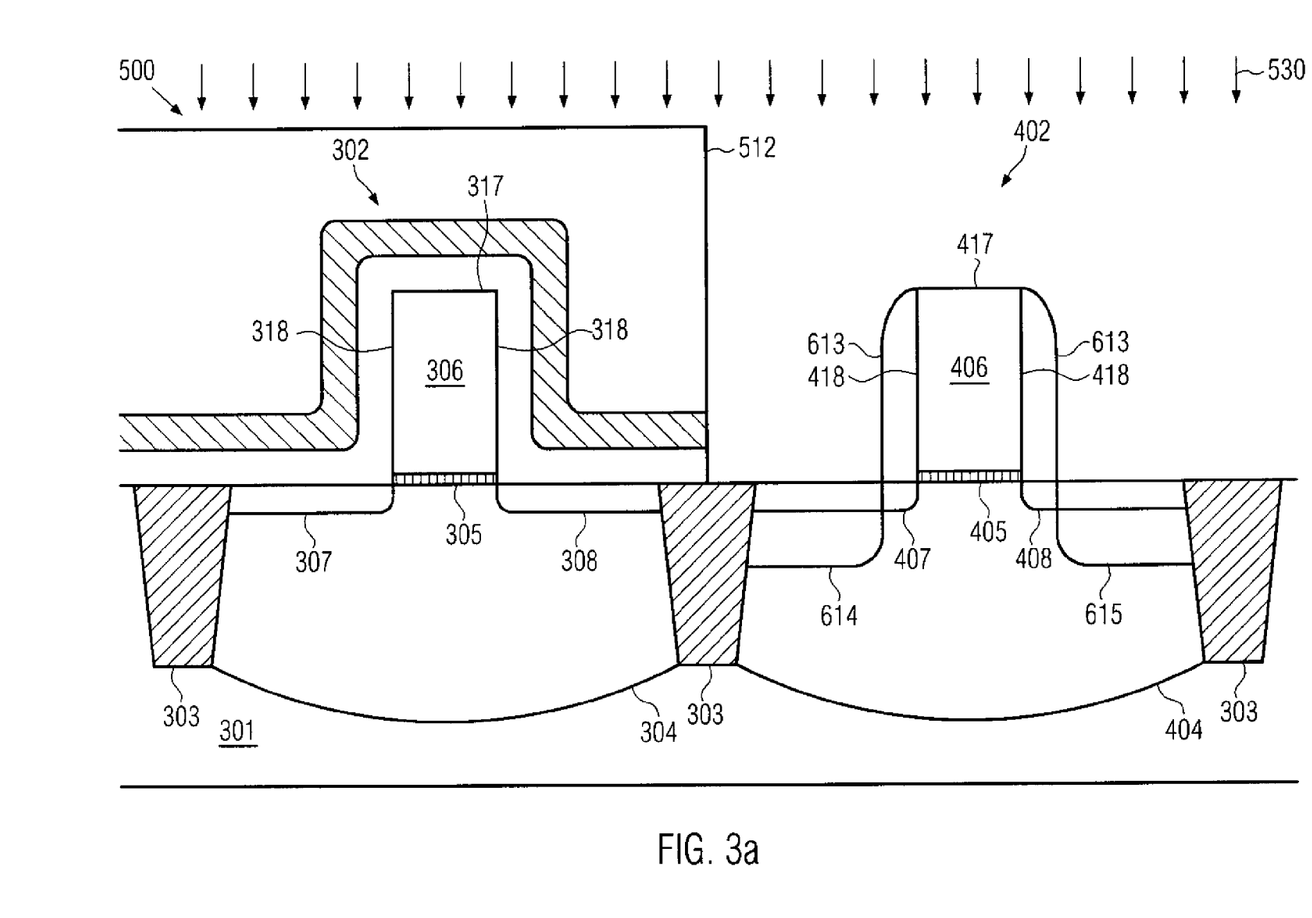
FIGS. 3a-3b show schematic cross-sectional views of a semiconductor structure in stages of a manufacturing process according to another illustrative embodiment.

FIG. 3a shows a schematic cross-sectional view of a semiconductor structure 500 in a first stage of a manufacturing process. The semiconductor structure 500 comprises a substrate 301. In the substrate 301, a first transistor element 302, a second transistor element 402 and a trench isolation structure 301 are formed. The first transistor element 302 comprises an active region 304, a gate electrode 306 having a top surface 317 and a side surface 318, a gate insulation layer 305, an extended source region 307 and an extended drain region 308. Similarly, the second transistor element comprises an active region 404, a gate electrode 406 having a top surface 417 and a side surface 418, a gate insulation layer 405, an extended source region 407 and an extended drain region 408. These features may be formed by means of methods of photolithography, etching, deposition, oxidation and ion implantation well known to persons skilled in the art.

The first transistor element 302 and the second transistor element 402 may be transistors of a different type. In some embodiments, the first transistor element 302 may be a P-type transistor and the second transistor element 402 may be an N-type transistor. In other embodiments, the first transistor element 302 may be an N-type transistor and the second transistor element 402 may be a P-type transistor, or the first transistor element 302 and the second transistor element 402 may be transistors of the same type.

Similar to the embodiments described above with reference to FIGS. 2a-2c, a layer 309 of a first material and a layer 310 of a second material may be formed over the first transistor element 302 and the second transistor element 402 by means of known deposition techniques such as chemical vapor deposition and/or plasma enhanced chemical vapor deposition. In some embodiments, the layer 309 may comprise silicon nitride and the layer 310 may comprise silicon dioxide.

After the formation of the layers 309, 310, a mask 512 which may comprise a photoresist, may be formed over the first transistor element 302. This may be done by means of known methods of photolithography.

Thereafter, an etch process adapted to selectively remove the second material of the layer 310 may be performed to remove a portion of the layer 310 over the second transistor element 402. The etch process may comprise an isotropic etch process such as a wet etch process. For example, in embodiments wherein the layer 310 comprises silicon dioxide, the semiconductor structure 500 may be exposed to diluted hydrofluoric acid. In other embodiments, a dry etch process may be used.

The present disclosure is not restricted to embodiments wherein the portion of the layer 310 over the second transistor element is completely removed. In other embodiments, the etch process may be an anisotropic etch process which is stopped upon a substantial removal of substantially horizontal parts of the portion of the layer 310 over the second transistor element 402. Thus, a sidewall spacer structure (not shown) may be formed from the layer 310 adjacent the second transistor element 402. A shape of the sidewall spacer structure may be controlled independently of the shape of sidewall spacer structures which are formed in the first transistor element 302, as will be explained in more detail below.

After completely or partially removing the portion of the layer 310 over the second transistor element 402, an anisotropic etch process adapted to selectively remove the first material of the layer 309 may be performed. The anisotropic etch process may be stopped upon a removal of substantially horizontal portions of the layer 309, such that portions of the layer 309 may remain on the sidewall 418 of the gate electrode 406 of the second transistor element 402 to form a sidewall spacer structure 613.

Thereafter, an ion implantation process wherein the semiconductor structure 500 is irradiated with ions of a dopant material may be performed, as indicated by arrows 530 in FIG. 3a. The mask 512 may remain on the semiconductor structure 300 during the ion implantation process. In the ion implantation process, a source region 614 and a drain region 615 may be formed adjacent the gate electrode 406 of the second transistor element 402, similar to the formation of the source region 414 and the drain region 415 in the embodiments described above with reference to FIGS. 2a-2c.

Figure 3B:
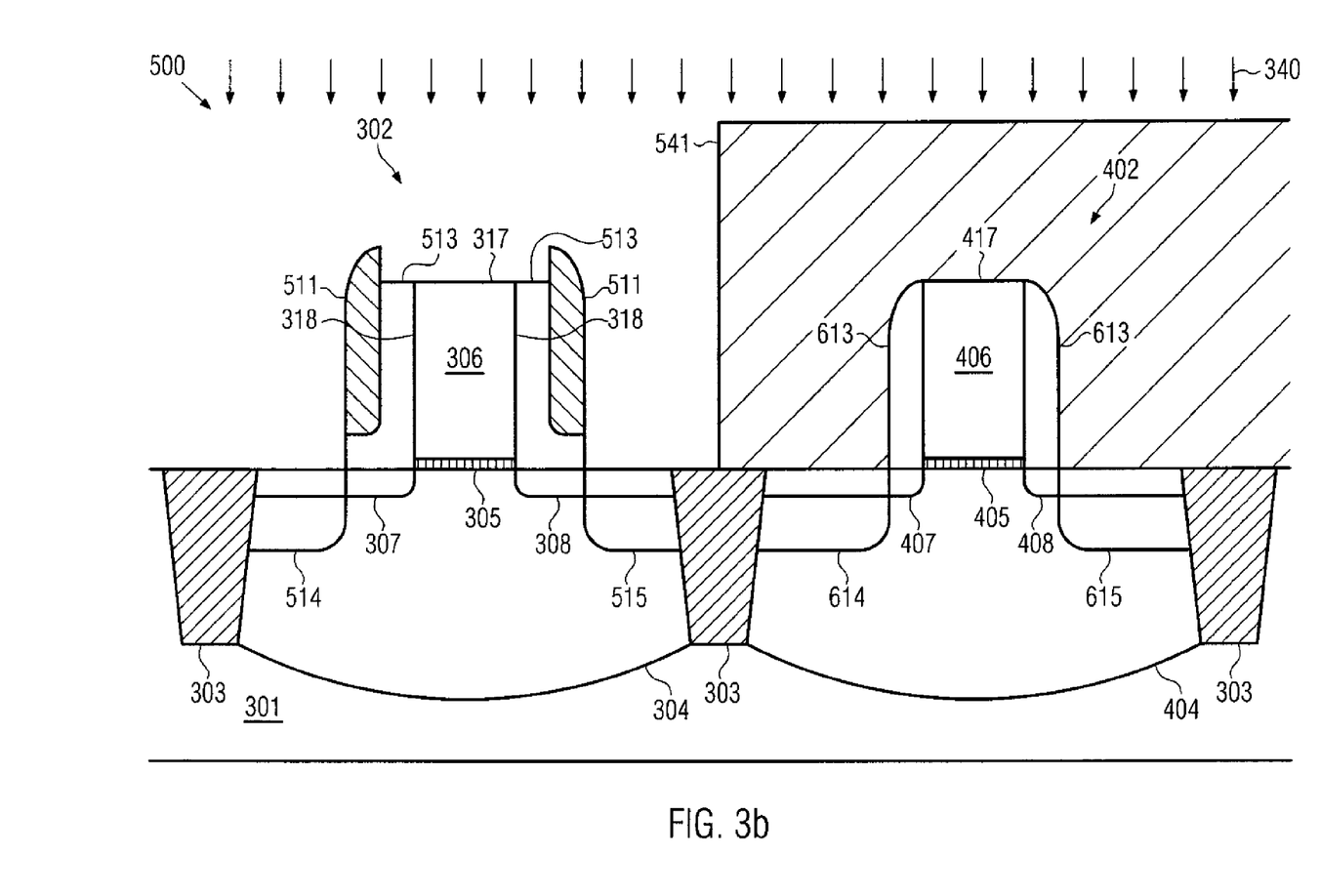

FIG. 3b shows a schematic cross-sectional view of the semiconductor structure 500 in a later stage of the manufacturing process. After the formation of the source region 614 and the drain region 615, the mask 512 may be removed by means of a known resist strip process, and a mask 541 may be formed over the second transistor element 402. The mask 541 may comprise a photoresist and may be formed by means of techniques of photolithography well known to persons skilled in the art.

Thereafter, an anisotropic etch process adapted to remove both the first material in the layer 309 and the second material in the layer 310 may be performed. In some embodiments, the anisotropic etch process may be a dry etch process. For example, in embodiments wherein the layer 309 comprises silicon nitride and the layer 310 comprises silicon dioxide, the anisotropic etch process may be configured to remove silicon dioxide and silicon nitride at a substantially equal etch rate. Parameters of the etch process adapted for this purpose are known to persons skilled in the art or may readily be determined by means of routine experiments.

The anisotropic etch process may be stopped upon a substantial removal of portions of the layer 309 and the layer 310 over substantially horizontal portions of the first transistor element 302, for example, portions over the extended source region 307 and the extended drain region 308, and portions over the top surface 317 of the gate electrode 306. Due to the anisotropy of the etch process, residues of the layer 309, 310 at the sidewall 318 of the gate electrode 306 may remain on the semiconductor structure 500 after the etch process to form sidewall spacer structures 511, 513, wherein residues of the layer 309 form a sidewall spacer structure 513 and residues of the layer 310 form a sidewall spacer structure 511.

The present invention is not restricted to embodiments wherein an anisotropic etch process adapted to simultaneously remove both the first material and the second material is performed. In other embodiments, an etch process comprising two phases may be used to form the sidewall spacer structures 511, 513. In the first phase, an anisotropic etch process adapted to selectively remove the second material in the layer 310, leaving the first material in the layer 309 substantially intact may be performed to form the sidewall spacer structure 511. Then, in the second phase, a further anisotropic etch process adapted to selectively remove the first material in the layer 309, leaving the second material in the sidewall spacer structure 511 substantially intact, may be performed to form the sidewall spacer structure 513.

In some embodiments, the first and the second phase of the anisotropic etch process may each comprise a dry etch process and may be performed in one reactor chamber. In such embodiments, etch parameters, in particular the composition of the etch gas, may first be adapted to perform the selective anisotropic etching of the second material. After the removal of the substantially horizontal portions of the layer 310 of the second material, the etch parameters may be changed to perform the anisotropic etching of the second material. In other embodiments, the two phases of the anisotropic etch process may be performed in distinct reactor chambers.

After the formation of the sidewall spacer structures 511, 513, an ion implantation process wherein the semiconductor structure 500 is irradiated with ions of a dopant material may be performed, as indicated by arrows 540 in FIG. 3b. The mask 541 may remain on the semiconductor structure 500 during the ion implantation process. Thus, the second transistor element 402 is protected from being irradiated with ions by the mask 541. In the first transistor element 302, the ions may impinge on portions of the substrate 301 adjacent the gate electrode 306 flanked with the sidewall spacer structures 511, 513. The ions may be incorporated into the substrate 301. Thus, a source region 514 and a drain region 515 may be formed in the first transistor element 302.

In the first transistor element 302, a distance between the source and drain regions 514, 515 and the gate electrode 306 may be greater than a distance between the source and drain regions 614, 615 and the gate electrode 406 in the second transistor element 402, since the total thickness of the sidewall spacer structures 511, 513 may be greater than the thickness of the sidewall spacer structure 613. Hence, the method of forming a semiconductor structure described above with reference to FIGS. 3a-3b allows the formation of different dopant profiles in the first transistor element 302 and the second transistor element 403. This may be particularly advantageous in embodiments wherein the first transistor element 302 and the second transistor element 402 are transistors of a different type, for example, in embodiments wherein the first transistor element 302 is a P-type transistor and the second transistor element 402 is an N-type transistor. Two masks formed by means of a photolithographic process, namely the mask 512 and the mask 541, are employed in the formation of the source regions 514, 614 and the drain regions 515, 615. Hence, similar to the embodiments described above with reference to FIGS. 2a-2c, the number of photolithographic processes may be reduced compared to the method according to the state of the art described above with reference to FIGS. 1a-1c.

Moreover, compared to the embodiments described above with reference to FIGS. 2a-2c, the embodiments described with reference to FIGS. 3a-3b may allow reduction of the number of etch processes used, since the sidewall spacer structures 511, 513 may be formed in a common etch process.

Further embodiments will be described with reference to FIGS. 4a-4b. For convenience, in FIGS. 4a-4b, as well as in FIGS. 2a-2c and 3a-3b, like reference numerals have been used to denote like components.

Figure 4A:
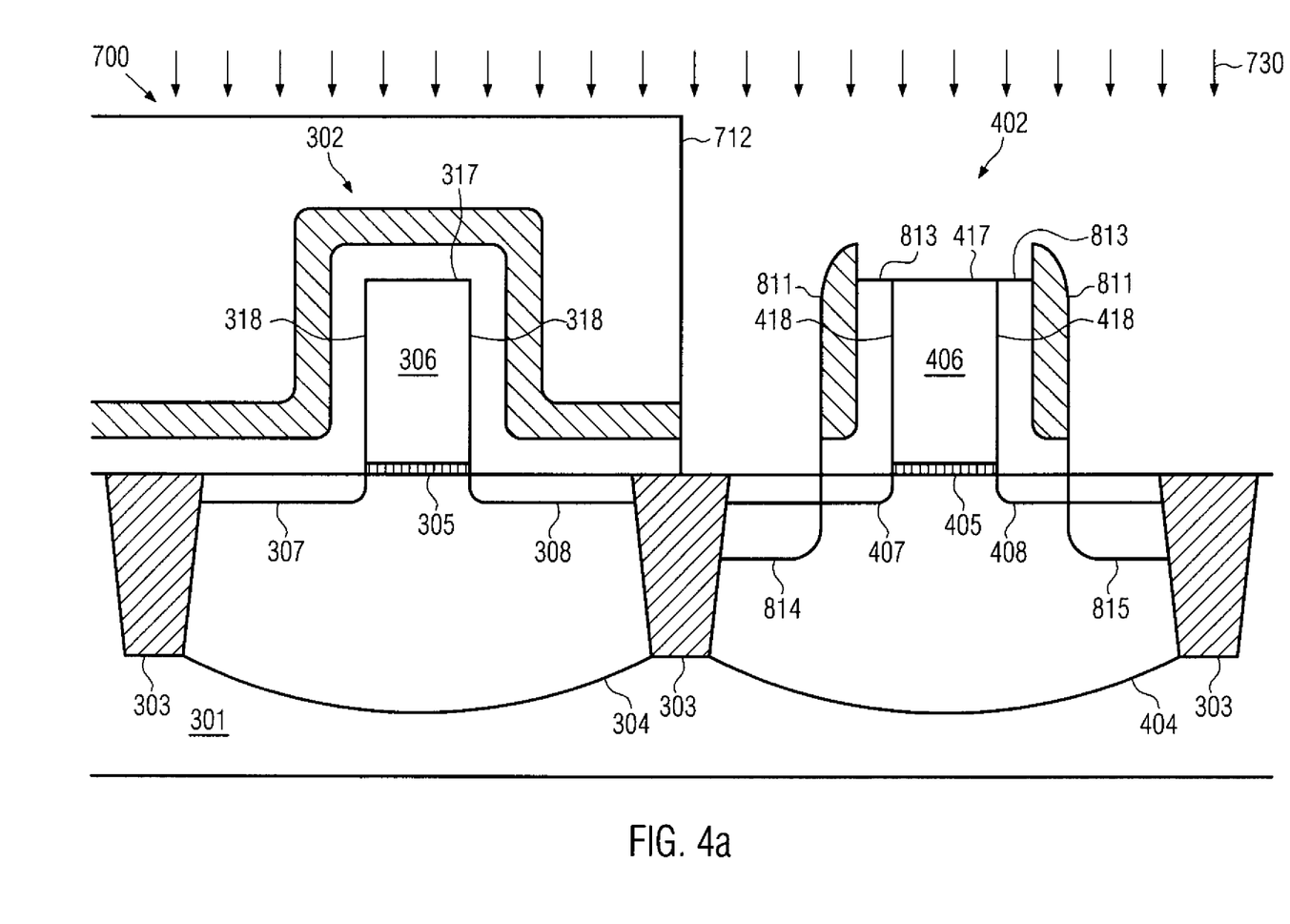
FIGS. 4a-4b show schematic cross-sectional views of a semiconductor structure in stages of a manufacturing process according to yet another illustrative embodiment.

FIG. 4a shows a schematic cross-sectional view of a semiconductor structure 700 in a first stage of a manufacturing process according to an embodiment. The semiconductor structure 700 comprises a semiconductor substrate 301. In the substrate 301, a first transistor element 302 and a second transistor element 402 are formed. The first transistor element 302 comprises an active region 304, a gate electrode 306 comprising a top surface 317 and a side surface 318, a gate insulation layer 305, an extended source region 307 and an extended drain region 308. Similarly, the second transistor element 402 comprises an active region 404, a gate electrode 406 comprising a top surface 417 and a side surface 418, a gate insulation layer 405, an extended source region 407 and an extended drain region 408. Additionally, a trench isolation structure 303 may be formed in the substrate 301. These features may be formed by means of manufacturing methods well known to persons skilled in the art.

Similar to the embodiments described above with reference to FIGS. 2a-2c and 3a-3b, the first transistor element 302 and the second transistor element 402 may be transistors of the same type, or may be transistors of a different type. For example, the first transistor element 302 may be a P-type transistor and the second transistor element 402 may be an N-type transistor.

A layer 309 of a first material and a layer 310 of a second material may be formed over the semiconductor structure 700. Similar to the embodiments described above with reference to FIGS. 2a-2c and 3a-3b, the layer 309 and the layer 310 may comprise materials which may be selectively etched. For example, the layer 309 may comprise silicon nitride and the layer 310 may comprise silicon dioxide.

After the formation of the layer 309 of the first material and the layer 310 of the second material, a mask 712 may be formed over the first transistor element 302. The mask 712 may comprise a photoresist and may be formed by means of a photolithographic process well known to persons skilled in the art.

Thereafter, an anisotropic etch process adapted to remove the first material in the layer 309 and the second material in the layer 310 may be performed. In some embodiments, the anisotropic etch process may be a dry etch process wherein etch parameters, such as, for example, the composition of the etch gas, are adapted such that both the first material and the second material are removed. In other embodiments, the anisotropic etch process may comprise a first phase wherein the etch parameters are adapted for selective etching of the second material, and a second phase wherein the etch parameters are adapted for selective etching of the first material. While, in some embodiments, the first phase and the second phase of the anisotropic etch process may be performed in a single reactor vessel, in other embodiments, the first phase and the second phase may be performed in different reactor vessels.

In the etch process, portions of the layers 309, 310 over the first transistor element 302 may be protected from being affected by one or more etchants used in the anisotropic etch process by the mask 712. Thus, only portions of the layers 309, 310 over the second transistor element 402 are etched. The anisotropic etch process may be stopped upon a substantial removal of portions of the layers 309, 310 over substantially horizontal portions of the second transistor element 402, for example, portions over the extended source region 407, the extended drain region 408 and the top surface 417 of the gate electrode 406. Due to the anisotropy, inclined portions of the layers 309, 310 on the sidewall 418 of the gate electrode 406 of the second transistor element 402 may remain on the surface of the semiconductor structure 700. The portions of the layer 309 at the sidewall 418 of the gate electrode 406 may form a sidewall spacer structure 813, and the portions of the layer 310 at the sidewall 418 of the gate electrode 406 may form another sidewall spacer structure 811. Thus, in the anisotropic etch process, two sidewall spacer structures 811, 813 may be formed adjacent the gate electrode 406.

After the formation of the sidewall spacer structures 811, 813, an ion implantation process may be performed wherein the semiconductor structure 700 is irradiated with ions of a dopant material, as indicated by arrows 730 in FIG. 4a. The ions may be incorporated into portions of the substrate 301 adjacent the gate electrode 406 and the sidewall spacer structures 811, 813 such that a source region 814 and a drain region 815 of the second transistor element 402 are formed. The mask 712 may remain on the semiconductor structure 700 during the ion implantation process. Hence, the mask 712 may absorb ions impinging on the first transistor element 302 such that no source and drain regions are formed in the first transistor element 302.

Figure 4B:
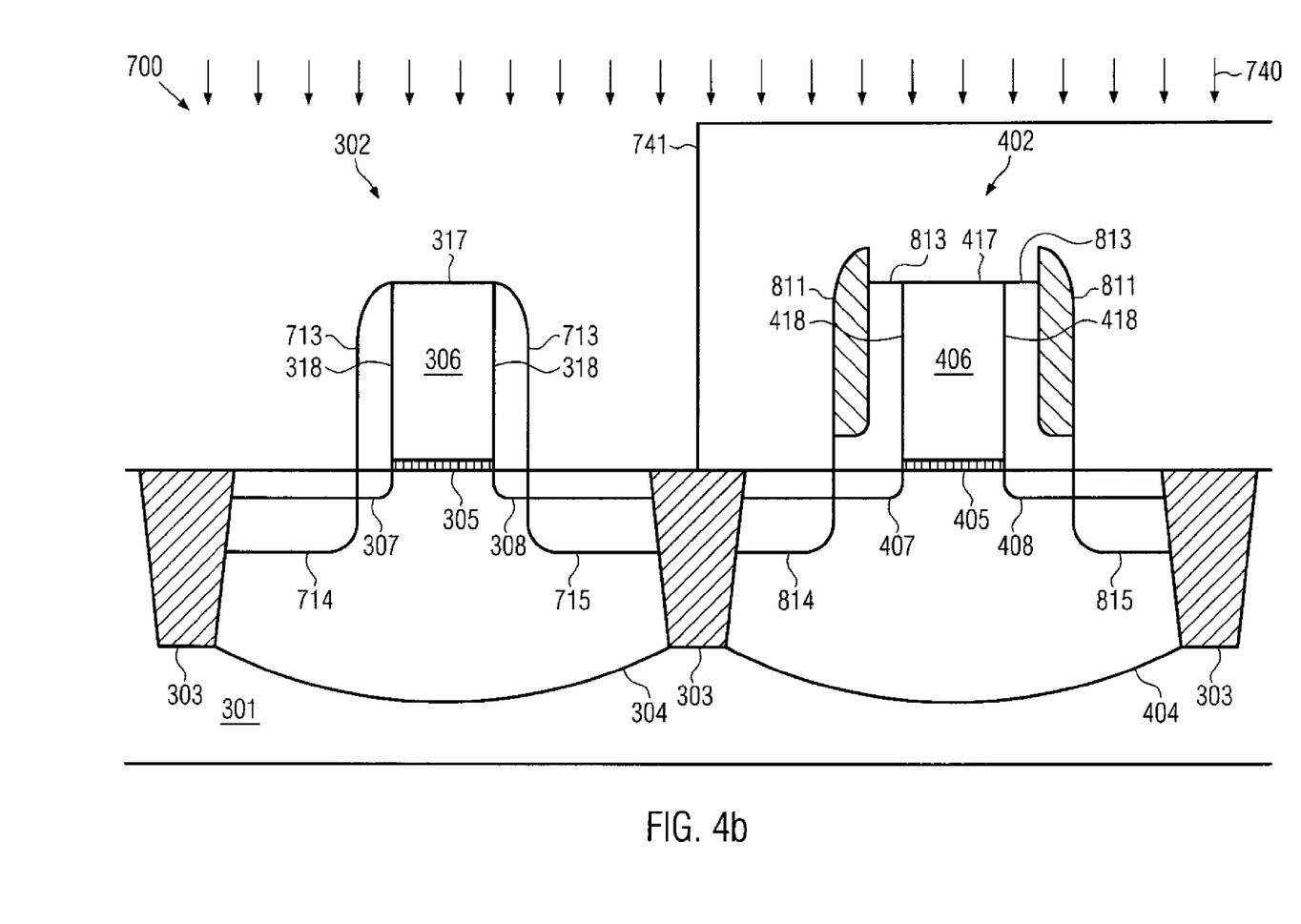

FIG. 4b shows a schematic cross-sectional view of the semiconductor structure 700 in a later stage of the manufacturing process. After the formation of the source region 814 and the drain region 815 of the second transistor element 402, the mask 712 may be removed by means of a known resist strip process and a mask 741 may be formed over the second transistor element 402. Similar to the mask 712 described above, the mask 741 may comprise a photoresist and may be formed by means of methods of photolithography well known to persons skilled in the art.

Thereafter, an etch process may be performed to remove a portion of the layer 310 over the first transistor element 302. In some embodiments, the etch process may be a wet etch process wherein the semiconductor structure is exposed to a solution of an etchant, for example, by inserting the semiconductor structure 700 into the solution or by spraying the solution to the semiconductor structure 700. The etchant may be adapted to selectively remove the second material in the layer 310, leaving the first material in the layer 309 substantially intact. In embodiments wherein the second material comprises silicon dioxide, the semiconductor structure may be exposed to diluted hydrofluoric acid (HF).

The present invention is not restricted to embodiments wherein the portion of the layer 310 over the first transistor element 302 is removed by means of a wet etch process. In other embodiments, a dry etch process which may, in some embodiments, be substantially isotropic, can be used for this purpose.

The present disclosure is not restricted to embodiments wherein the portion of the layer 310 over the first transistor element 302 is completely removed. In other embodiments, an anisotropic etch process may be performed to form a sidewall spacer structure (not shown) from the portion of the layer 310 over the first transistor element 302.

After the complete or partial removal of the portions of the layer 310 over the first transistor element 302, an anisotropic etch process adapted to selectively remove the first material in the layer 309 may be performed. In some embodiments, the anisotropic etch process may comprise a known dry etch process.

The anisotropic etch process may be stopped upon a substantial removal of substantially horizontal portions of the layer 310, such as, for example, portions over the extended source region 307, the extended drain region 308 and the top surface 317 of the gate electrode 306 of the first transistor element 302. Due to the anisotropy of the etch process, portions of the layer 309 at the sidewall 318 of the gate electrode 306 may remain on the semiconductor structure 700 to form a sidewall spacer structure 713 adjacent the gate electrode 306.

After the formation of the sidewall spacer structure 713, an ion implantation process may be performed wherein the semiconductor structure 700 is irradiated with ions of a dopant material, as indicated by arrows 740 in FIG. 4b. The mask 741 may remain on the semiconductor structure 700 during the ion implantation process, absorbing ions 740 impinging on the second transistor element 420. Thus, an implantation of the ions 740 into the source region 814 and the drain region 815 of the second transistor element 402 may be substantially avoided. Ions impinging adjacent the sidewall spacer structure 713 in the first transistor element 302, however, may be incorporated into the substrate 301 to form a source region 714 and a drain region 715 of the first transistor element 302.

After the formation of the source region 714 and the drain region 715, the mask 741 may be removed by means of a known resist strip process.

The source region 714 and the drain region 715 in the first transistor element 302 may be provided at distance to the gate electrode 306 which is smaller than the distance between the gate electrode 406 of the second transistor element 402 and the source and drain regions 814, 815. A distance between the source and drain regions 714, 715 and the gate electrode 306 may correspond to a thickness of the sidewall spacer structure 713 of the first transistor element 302, which may be smaller than a distance between the source and drain regions 814, 815 and the gate electrode 406, corresponding to the combined thickness of the sidewall spacer structures 811, 813 in the second transistor element 402.

In the formation of the source regions 714, 814 and the drain regions 715, 815, not more than two masks, namely the masks 712, 741, need to be formed. Hence, no more than two photolithographic processes need to be performed. Thus, compared to the method of forming a semiconductor structure described above with reference to FIGS. 1a-1c, the number of photolithographic processes may be reduced, which may help to reduce the cost and complexity of the manufacturing process.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method of forming a semiconductor structure, comprising:
   providing a semiconductor substrate comprising a first feature and a second feature;
   forming a layer of a first material and a layer of a second material over said first feature and said second feature;
   forming a first mask over said first feature;
   performing at least one first etch process in the presence of said first mask adapted to remove said layer of second material and portions of said layer of first material over said second feature to form at least one first sidewall spacer structure adjacent said second feature from a first remaining portion of said layer of first material, wherein said first sidewall spacer structure does not include a remaining portion of said layer of second material;
   performing a first ion implantation process in the presence of the first sidewall spacer structure, wherein said first mask remains over said first feature during said first ion implantation process;
   forming a second mask over said second feature;
   performing at least one second etch process in the presence of said second mask adapted to remove portions of said layer of first material over said first feature and to form at least one second sidewall spacer structure adjacent said first feature from a second remaining portion of said layer of first material and a first remaining portion of said layer of second material; and
   performing a second ion implantation process in the presence of the second sidewall spacer structure, wherein said second mask remains over said second feature during said second ion implantation process.

2. The method of claim 1, wherein each of said first feature and said second feature comprises a gate electrode.

3. The method of claim 1, wherein said layer of second material is formed over said layer of first material.

4. The method of claim 3, further comprising performing a third etch process before said formation of said first mask, wherein said third etch process is anisotropic and adapted to selectively remove portions of said second material and provide said first remaining portion of said second layer of material of said second sidewall spacer structure.

5. The method of claim 4, wherein said third etch process is stopped upon a removal of portions of said layer of second material over substantially horizontal portions of said first and second feature such that portions of said layer of second material over inclined portions of said first and second feature remain over said substrate.

6. The method of claim 5, wherein said at least one first etch process comprises an isotropic etch process adapted to selectively remove said portions of said layer of second material over said inclined portions of said second feature and an anisotropic etch process adapted to selectively remove said second material, said anisotropic etch process being stopped upon a removal of portions of said layer of first material over substantially horizontal portions of said second feature such that portions of said layer of first material over inclined portions of said second feature remain over said substrate to form said first sidewall spacer structure.

7. The method of claim 4, wherein said at least one second etch process comprises an anisotropic etch process adapted to selectively remove said first material.

8. The method of claim 7, wherein said anisotropic etch process of said at least one second etch process is stopped upon a removal of portions of said layer of first material over substantially horizontal portions of said first feature such that portions of said layer of first material and said layer of second material over inclined portions of said first feature remain over said substrate to form said second sidewall spacer structure.

9. The method of claim 3, wherein said at least one first etch process comprises an isotropic etch process adapted to selectively remove portions of said layer of second material located over said second feature and an anisotropic etch process adapted to selectively remove said first material.

10. The method of claim 9, wherein said anisotropic etch process is stopped upon a removal of portions of said layer of first material over substantially horizontal portions of said second feature such that portions of said layer of first material over inclined portions of said second feature remain over said substrate to form said first sidewall spacer structure.

11. The method of claim 1, wherein said second etch process comprises at least one anisotropic etch process adapted to remove said first material and said second material.

12. The method of claim 11, wherein said at least one anisotropic etch process is stopped upon removal of portions of said layer of first material and said layer of second material over substantially horizontal portions of said first feature, such that portions of said layer of first material and said layer of second material over inclined portions of said first feature remain over said substrate to form said second sidewall spacer structure.

13. The method of claim 1, wherein one of said first ion implantation process and said second ion implantation process comprises irradiating said semiconductor structure with ions of a P-type dopant and the other of said first ion implantation process and said second ion implantation process comprises irradiating said semiconductor structure with ions of an N-type dopant.

* * * * *